(12) United States Patent
Parhami

(10) Patent No.: US 8,093,719 B1
(45) Date of Patent: Jan. 10, 2012

(54) SEAL RING FOR PREVENTING CRACK PROPAGATION IN INTEGRATED CIRCUIT DEVICES

(75) Inventor: Farnaz Parhami, Fremont, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 289 days.

(21) Appl. No.: 11/281,098

(22) Filed: Nov. 16, 2005

Related U.S. Application Data (60) Provisional application No. 60/634,972, filed on Dec. 10, 2004.

(51) Int. Cl.
*H01L 23/04* (2006.01)

(52) U.S. Cl. .............. 257/730; 257/774; 257/E21.318

(58) Field of Classification Search .......... 257/127, 257/126, 547, 688, 730, 700, E21.318–E21.321, 257/758, 773–776

See application file for complete search history.

(56) References Cited

U.S. PATENT DOCUMENTS

| | | | |
|---|---|---|---|
| 6,879,023 B1 | 4/2005 | Gutierrez | |
| 7,224,060 B2 * | 5/2007 | Zhang et al. | 257/730 |
| 7,256,474 B2 * | 8/2007 | Wakayama et al. | 257/620 |
| 7,265,436 B2 | 9/2007 | Huang et al. | |
| 7,777,338 B2 * | 8/2010 | Yao et al. | 257/758 |

OTHER PUBLICATIONS

Farnaz Parhami and Stephen Pan, "Effect of Guard Ring Design and Properties of Inter-Layer Dielectric Film on Chip Reliability", IMECE, Nov. 2005, pp. 1-4, ASME.

* cited by examiner

*Primary Examiner* — Hoa B Trinh

(57) ABSTRACT

In one embodiment, an integrated circuit device includes an active area encompassed by a seal ring. The seal ring may include a deep moat formed on an outer edge of the seal ring. The deep moat may have a depth that extends substantially to the substrate to prevent cracks from propagating into the active area. Alternatively or in addition, the seal ring may include redundant vias.

20 Claims, 11 Drawing Sheets

Effect of Moat Depth on Stress Intensity Factor

SEAL RING FOR PREVENTING CRACK PROPAGATION IN INTEGRATED CIRCUIT DEVICES

CROSS-REFERENCE TO RELATED APPLICATION

This application claims the benefit of U.S. Provisional Application No. 60/634,972, filed Dec. 10, 2004, which is incorporated herein by reference in its entirety.

BACKGROUND OF THE INVENTION

1. Field of the Invention

The present invention relates generally to integrated circuits, and more particularly to integrated circuit fabrication processes and structures.

2. Description of the Background Art

Typical integrated circuit devices have a seal ring that encompasses an active area of a die. The seal ring, also referred to as a "guard ring," protects circuitry in the active area from ionic contamination and moisture penetration. The seal ring also helps prevent cracks from propagating to the active area during the dicing process.

Figure 1:
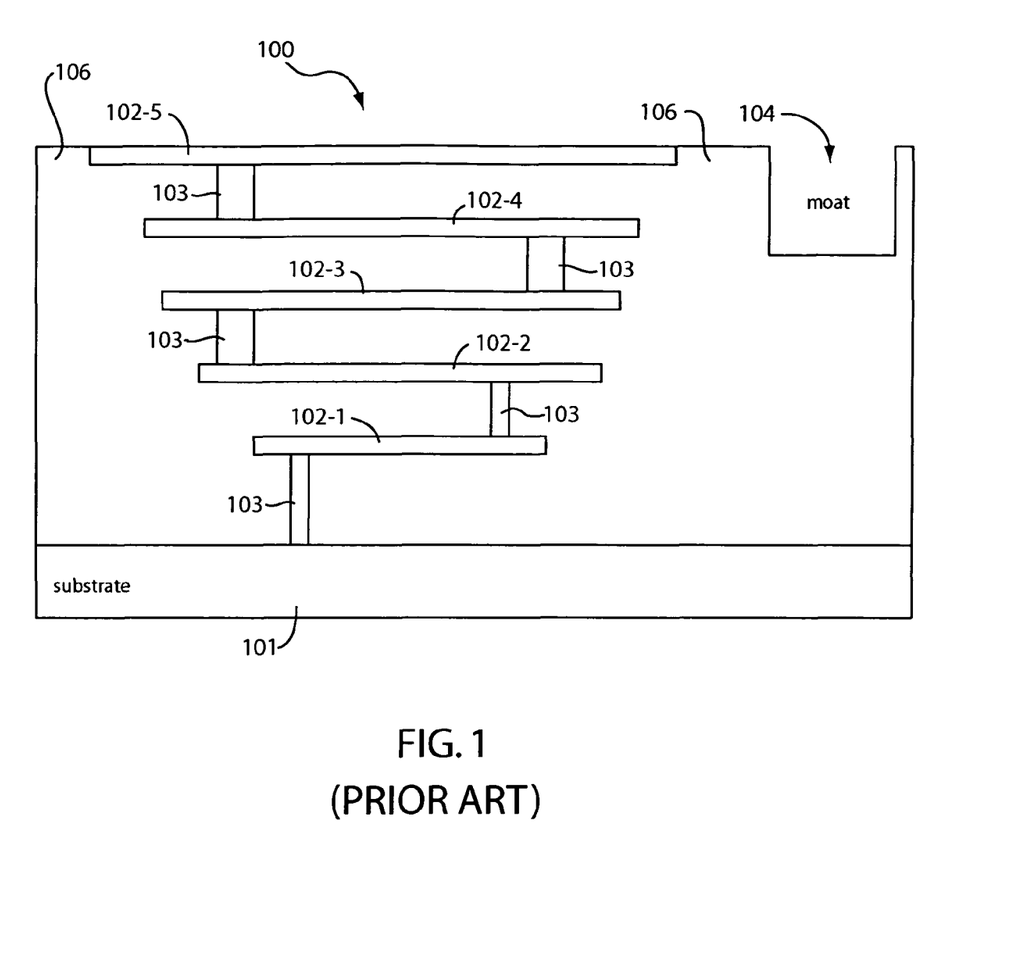
FIG. 1 schematically shows an example conventional seal ring with a shallow moat.

FIG. 1 schematically shows an example conventional seal ring 100. Seal ring 100 includes several seal ring metal layers 102 (i.e. 102-1, 102-2, . . . ) that are electrically coupled together by vias 103. One or more dielectric layers 106, which are not individually delineated in FIG. 1 for clarity of illustration, are formed between metal layers 102. As shown in FIG. 1, the metal layers 102 are formed such that an overlying metal layer 102 is wider than a metal layer 102 below it. The last metal layer 102, which is metal layer 102-1 in FIG. 1, is electrically connected to a semiconductor substrate 101.

Figure 2:
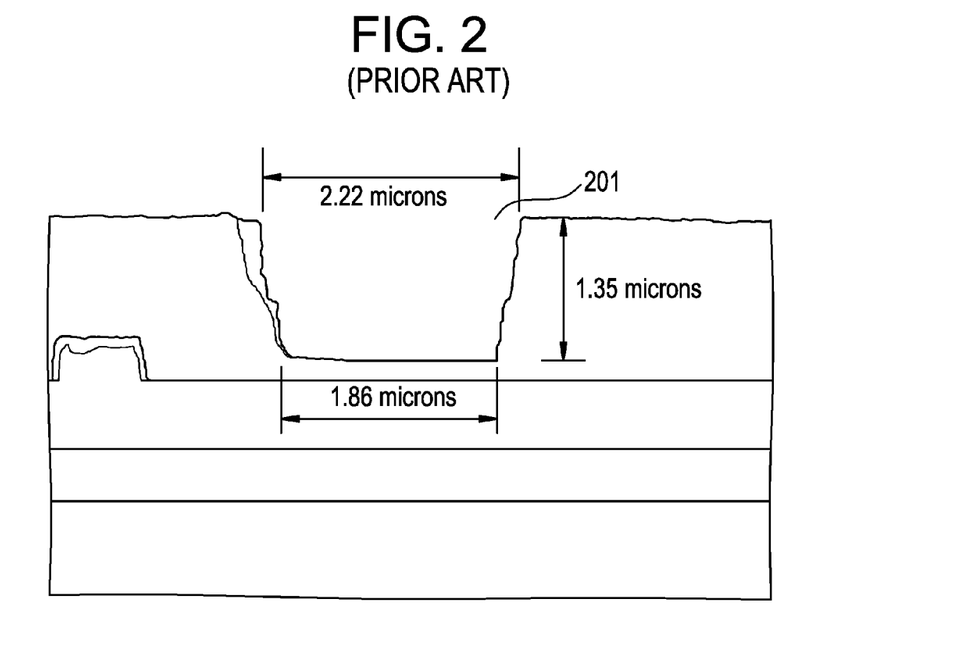
FIG. 2 shows an electron microscope image of an example conventional shallow moat.

The seal ring 100 also includes a shallow moat 104. Generally speaking, a moat is a trench formed in the seal ring to prevent cracks from propagating into the active area of the die (not shown). FIG. 2 shows an electron microscope image of an example conventional shallow moat 201. As noted in FIG. 2, the shallow moat 201 is 1.35 microns deep, 2.22 microns wide at the opening, and 1.86 microns wide at the bottom.

One problem with the seal ring 100 is that it is ineffective in capturing most cracks originating from the edge of the die. Another problem with the seal ring 100 is that as device size is reduced, the size of the vias 103 is also reduced. Yet another problem with the seal ring 100 is that the width of the seal ring 100 increases with the number of metal layers 102. This makes the seal ring 100 less desirable for multi-level metal technologies.

SUMMARY

In one embodiment, an integrated circuit device includes an active area encompassed by a seal ring. The seal ring may include a deep moat formed on an outer edge of the seal ring. The deep moat may have a depth that extends substantially to the substrate to prevent cracks from propagating into the active area. Alternatively or in addition, the seal ring may include redundant vias.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of integrated circuit structures and processing steps, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 3:
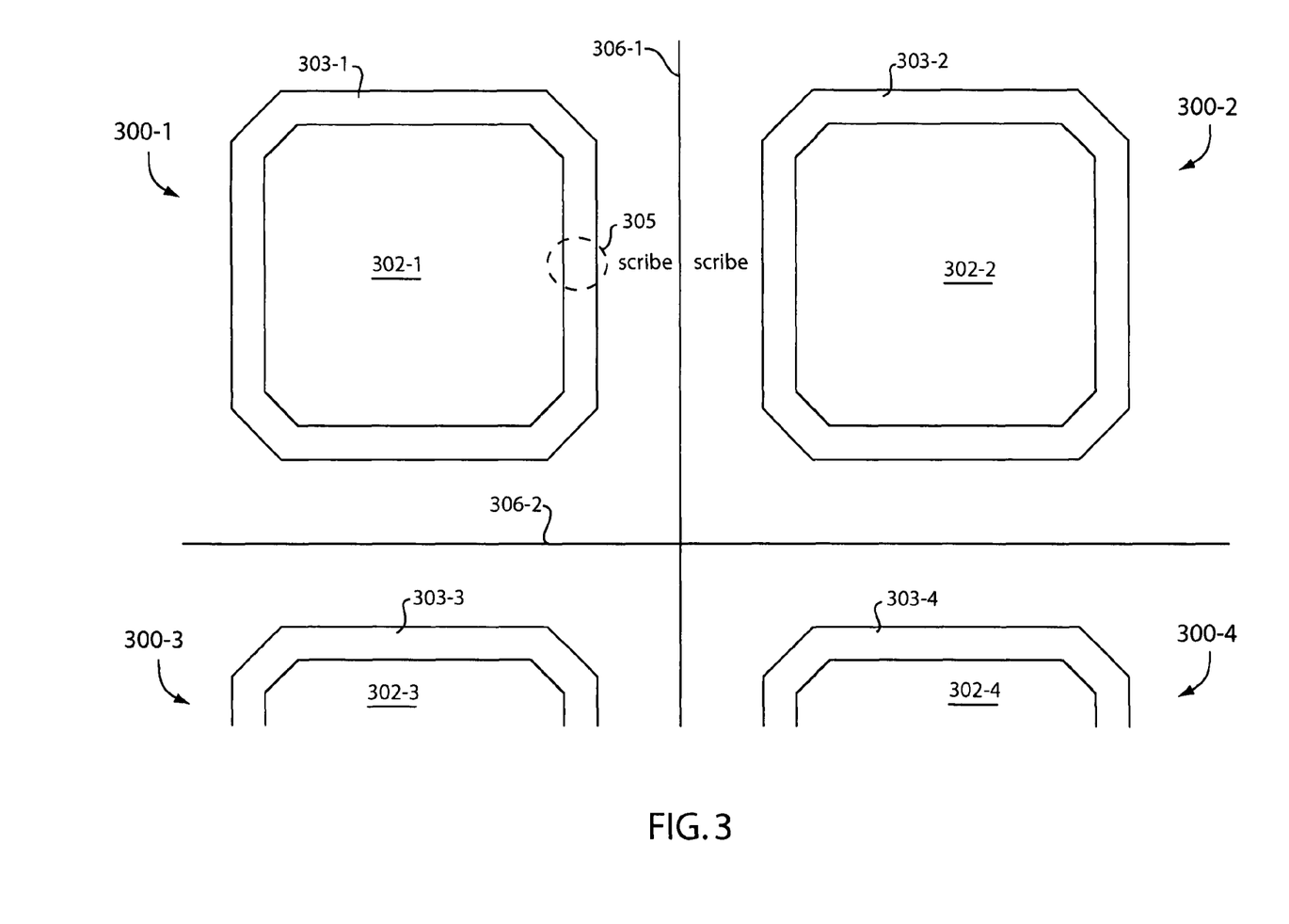
FIG. 3 schematically shows a top view of a semiconductor wafer containing a plurality of dies in accordance with an embodiment of the present invention.

FIG. 3 schematically shows a top view of a semiconductor wafer containing a plurality of dies 300 (i.e. 300-1, 300-1, . . . ) in accordance with an embodiment of the present invention. During dicing, the wafer is sawed along scribe lines 306 (i.e. 306-1, 306-2, . . . ) to separate each of the die 300 for packaging. Each die 300 includes a seal ring 303 (i.e. 303-1, 303-2, . . . ) encompassing an active area 302 (i.e. 302-1, 302-2, . . . ). In the example of FIG. 3, each seal ring 303 completely surrounds an active area 302. An active area 302 contains circuitry for performing the core functionality of the integrated circuit device. A seal ring 303 helps protect an active area 302 from ionic contamination and moisture penetration. A seal ring 303 also helps prevent cracks originating from an edge of the die from propagating into an active area 302. These cracks may occur during the dicing process or stress testing, for example.

Figures 4, 5:
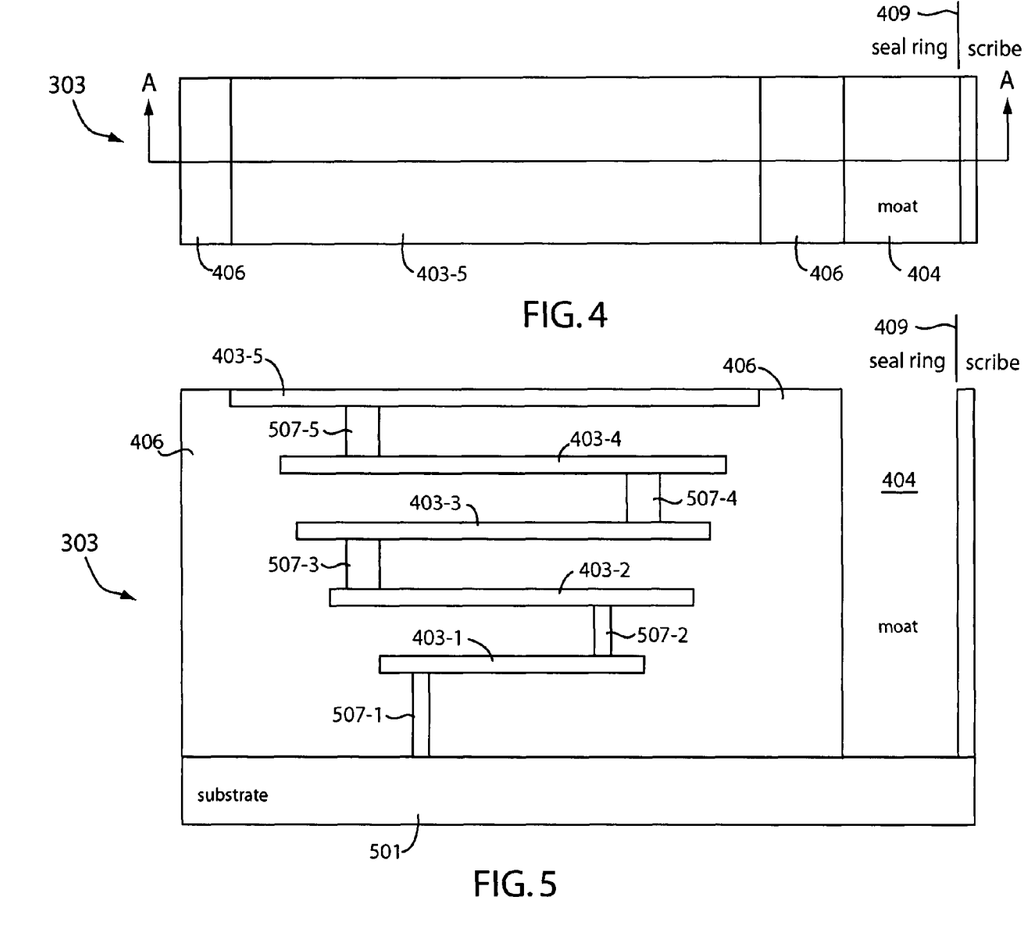
FIG. 4 shows an enlarged view of a region of a seal ring of FIG. 3.
FIG. 5 schematically shows a side cross-sectional view of a seal ring taken at section A-A of FIG. 4.

FIG. 4 shows an enlarged view of the dashed region 305 of the seal ring 303-1 of FIG. 3. Although taken at seal ring 303-1 for illustration purposes, the top view of FIG. 4 is applicable to any of the seal rings 303 of FIG. 3. As shown in FIG. 4, a seal ring 303 includes a seal ring metal layer 403-5 and a deep moat 404. As will be more apparent in FIG. 5, the deep moat 404 comprises a trench dug deep into one or more dielectric layers 406. The deep moat 404 may be formed at or near the outer edge of the seal ring 303. A line 409 provides a reference demarcating the seal ring 303 from the scribe.

FIG. 5 schematically shows a side cross-sectional view of the seal ring 303 taken at section A-A of FIG. 4. The seal ring 303 comprises a plurality of seal ring metal layers 403 (i.e. 403-1, 403-2, . . . ). In the example of FIG. 5, each metal layer 403 is wider than the next metal layer 403 below it. The metal layers 403 may also have substantially the same widths or other width variations without detracting from the merits of the present invention. Formed between each metal layer 403 are one or more dielectric layers 406. The dielectric layers 406 formed between the metal layers 403 are not individually delineated in FIG. 5 for clarity of illustration. The metal layers 403 are electrically coupled by way of vias 507 (i.e. 507-1, 507-2, . . . ). The last seal ring metal layer 403, metal layer 403-1 in the example of FIG. 5, may be electrically coupled to a substrate 501 by way of the via 507-1. Substrate 501 may comprise a semiconductor wafer, for example.

Still referring to FIG. 5, the deep moat 404 may be formed all the way to the silicon substrate. That is, the trench forming the deep moat 404 may be dug such that it is deep enough to extend or substantially extend to the substrate 501. The depth of the deep moat 404 may depend on the number of metal layers formed in the die. For example, in a device having two metal layers, the deep moat 404 may have a depth greater than or equal to about 2.5 microns. As another example, in a device with three metal layers, the deep moat 404 may be formed to a depth greater than or equal to about 3 microns. The deep moat 404 advantageously enhances the ability of the seal ring 303 to prevent cracks originating from an edge of the die from propagating to an active area 302 (see FIG. 3).

Figure 6:
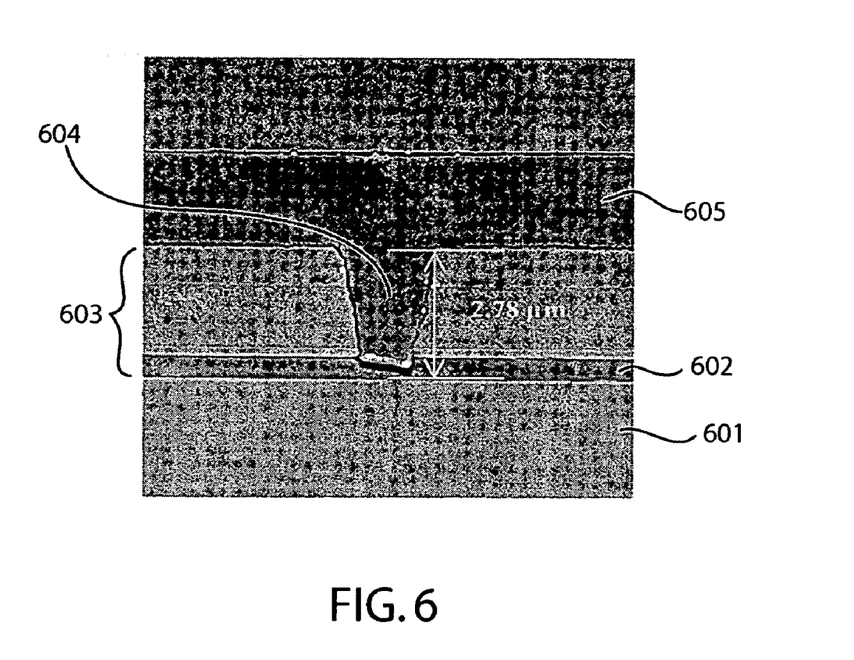
FIG. 6 shows an electron microscope image of a deep moat in accordance with an embodiment of the present invention.

FIG. 6 shows an electron microscope image of a deep moat 604 in accordance with an embodiment of the present invention. In the example of FIG. 6, the deep moat 604 is formed to a depth of about 2.78 microns. The deep moat 604 is dug to substantially reach the top surface of a substrate 601. The deep moat 604 is formed through dielectric layers 603. In the example of FIG. 6, the layer 602 comprises PSG, while the rest of dielectric layers 603 comprise TEOS. In practice, the deep moat 604 is not filled until after the die is cut from the wafer and prepared for packaging. That is, the deep moat 604 is left without anything in it until after the dicing process. In the example of FIG. 6, the deep moat 604 is filled with a material 605 only for the purpose of taking the electron microscope image.

Figure 7A:
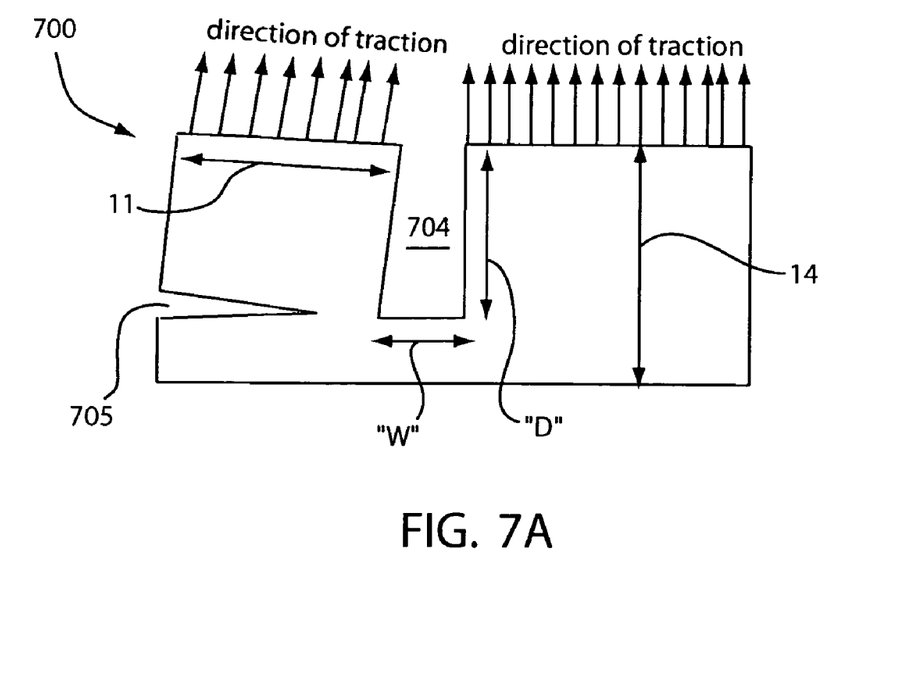
FIGS. 7A-7C schematically illustrate a finite element analysis of a seal ring.
Figure 7B:
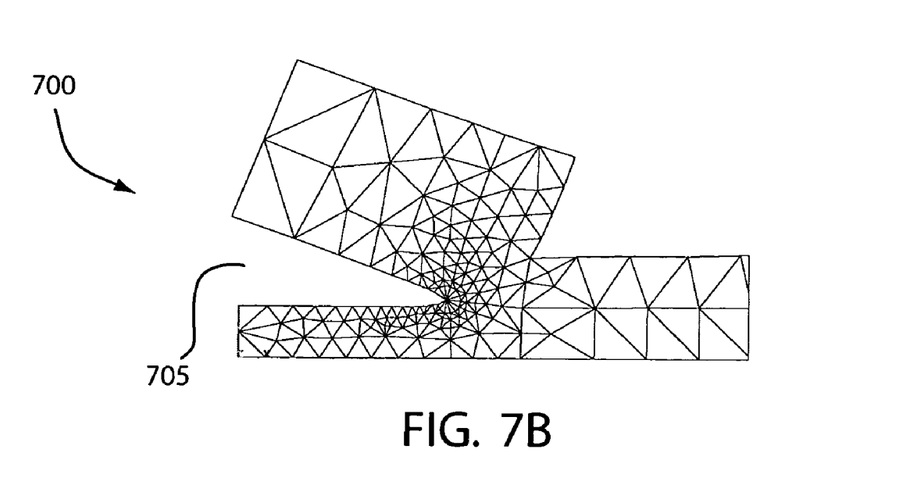
Figure 7C:
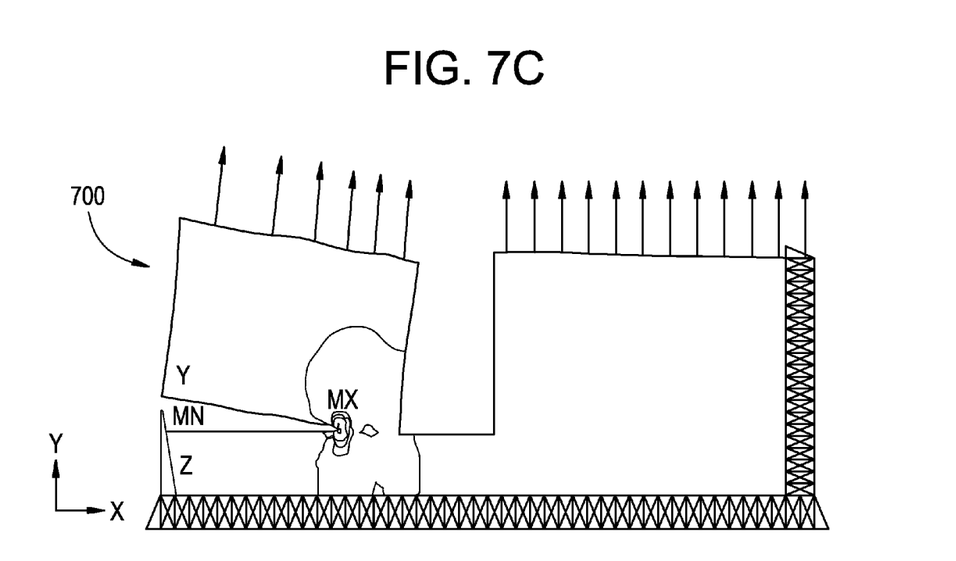

FIGS. 7A-7C schematically illustrate a finite element analysis of a seal ring 700. The finite element analysis was performed using the ANSYS finite element analysis software, commercially available from Ansys, Inc. FIG. 7A shows the seal ring 700 having a dimension 11 of 5 microns, a dimension 14 of 4 microns, and a crack 705 at the edge of the die. The crack 705 is assumed to be two dimensional in plane strain condition. The dimensions of the crack 705 represent a typical delaminated integrated circuit die. To evaluate the effect of the crack opening, a uniform traction in the direction shown in FIG. 7A is applied to the model with bottom and remote right hand side being fixed. Various values for widths "W" and depth "D" are used for the moat 704 to determine the effect of those moat dimensions in crack propagation. FIG. 7B shows the finite element model with quadratic elements and singular elements surrounding the tip of the crack 705. Deformed shape after scaling is shown in FIG. 7B to illustrate the details of the elements. FIG. 7C shows a Von Mises equivalent stress contour in the case where the moat 704 width "W" is 2 microns, the moat 704 depth "D" is 3 microns, the length of the crack 705 in the X direction (crack length) is 3.75 microns and the length of the crack 705 in the Y direction (crack elevation) is 1 micron.

Figure 8:
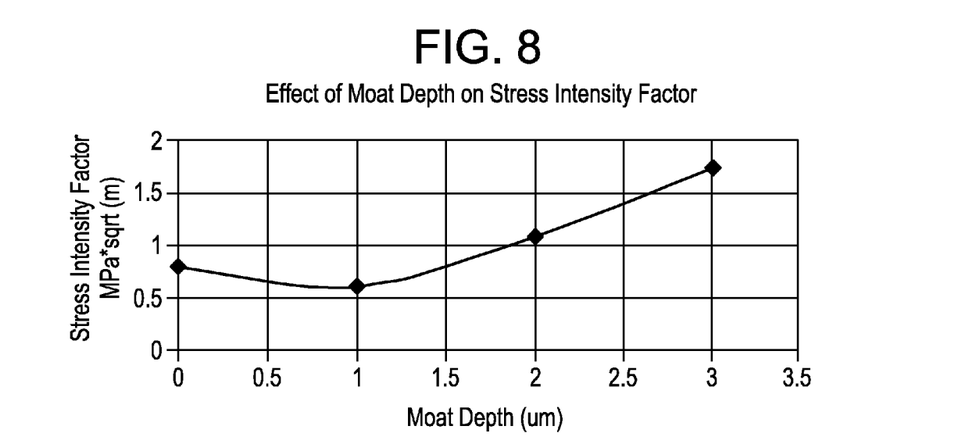
FIG. 8 shows a graph illustrating the effect of moat depth on stress intensity factor.

FIG. 8 shows a graph illustrating the effect of moat depth on stress intensity factor "$K_f$." The stress intensity factor is a measure of potential of crack propagation. The higher the stress intensity factor, the faster the crack propagates and thus terminates. Generally speaking, in terms of seal ring design, it is preferable to have a high stress intensity factor so that crack propagation terminates before it reaches the active area. From the finite element analysis illustrated in FIGS. 7A-7C, the inventor believes that that the width of a moat has no substantial effect on stress intensity factor. However, as shown in FIG. 8, the depth of a moat substantially affects the stress intensity factor, which increases with moat depth after about the 1 micron mark. That is, as the moat is made deeper, the intensity in front of a crack tip increases and terminates the crack before it can propagate into the die's active area. Therefore, deep moats, such as moat 404 of FIG. 5 and moat 604 of FIG. 6, are more effective in preventing crack propagation than conventional shallow moats.

Figure 9:
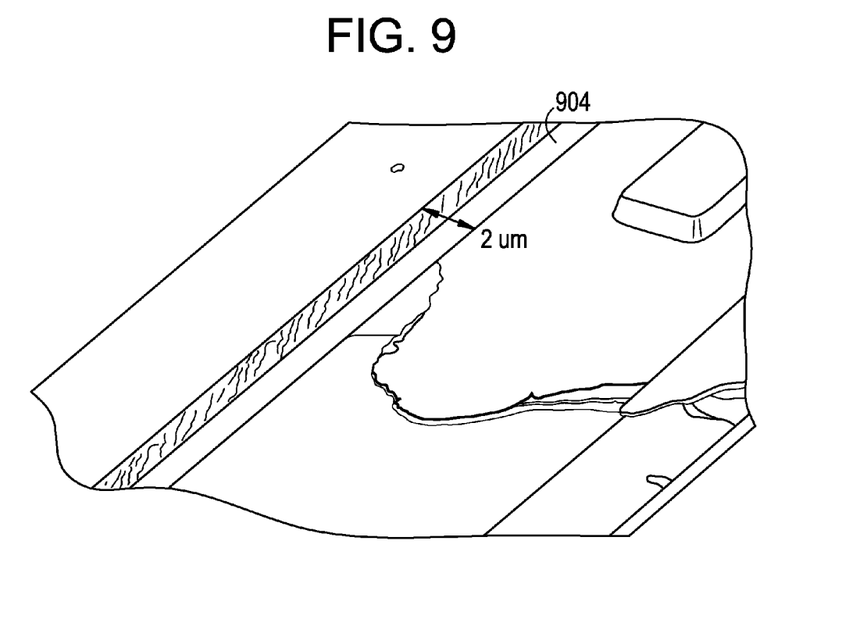
FIG. 9 shows an electron microscope image of a deep moat in accordance with an embodiment of the present invention.

FIG. 9 shows an electron microscope image of a deep moat 904 in accordance with an embodiment of the present invention. The deep moat 904 has a width of about 2 microns and a depth that extends substantially to the silicon substrate. As shown in FIG. 9, the deep moat 904 effectively terminated the propagation of a crack initiated at the edge of the die. Cracks may develop during dicing or stress testing (e.g. pressure cooker test). Cracks may delaminate layers of the device, resulting in catastrophic failures or reliability issues.

Figure 10A:
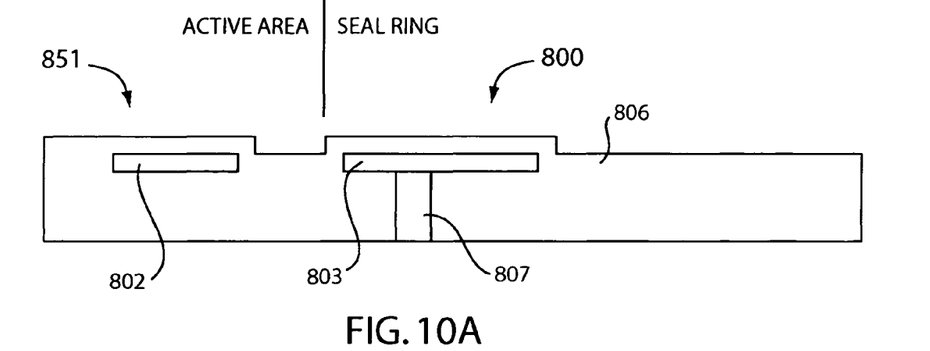
FIGS. 10A-10C schematically illustrate the fabrication of a deep moat in a seal ring in accordance with an embodiment of the present invention.
Figure 10B:
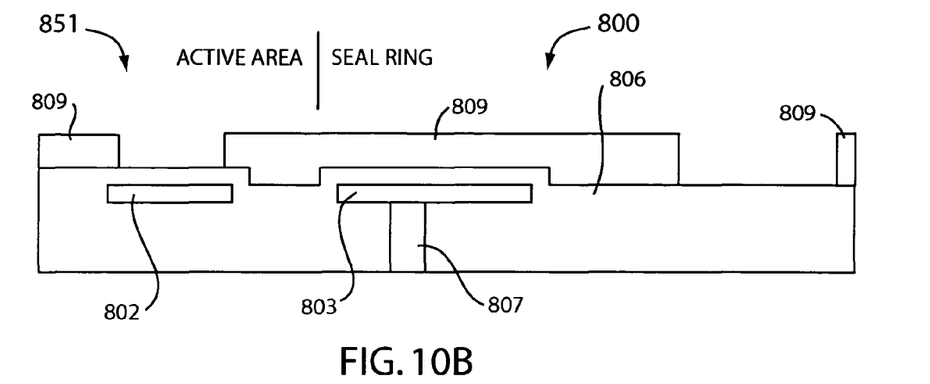
Figure 10C:
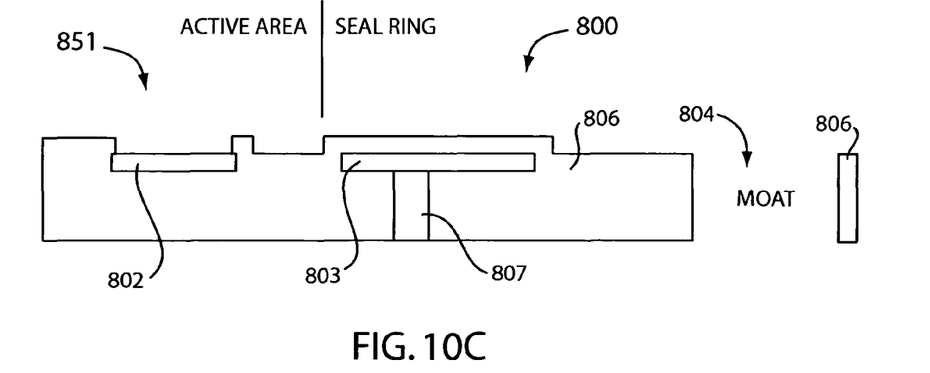

FIGS. 10A-10C schematically illustrate the fabrication of a deep moat 804 in a seal ring 800 in accordance with an embodiment of the present invention. FIGS. 10A-10C show side cross-sectional views of the die. In the example of FIGS. 10A-10C, the seal ring 800 encompasses an active area 851. The seal ring includes a plurality of seal ring metal layers 803 that are electrically coupled together by vias 807, but only one of each is shown for clarity of illustration. The active area 851 includes a bond pad metal 802, to which a bond wire will be subsequently attached during a wire bonding process performed for packaging. The wire bonding process is typically performed after the die has been sliced from the wafer (i.e. after dicing). One or more dielectric layers 806 are formed between metal layers of the die. Layers 806 may comprise silicon nitride, silicon dioxide, or other dielectric material without detracting from the merits of the present invention.

FIG. 10A shows the die before an etch process that exposes bond pad metals. In FIG. 10B, masks 809 are formed over the die in preparation for the bond pad metal etch (referred to as "Pad Mask Etch" or PDME) and deep moat etch. In FIG. 10C, a deep moat 804 is formed in dielectric layers 806 in the same etching step that exposes a top surface of the bond pad metal 802. That is, the deep moat 804 is dug into the dielectric layers 806 during the PDME process step that removes portions of the dielectric layers 806 from the top surface of the bond pad metal 802. Conventional PDME processes include an over etch of about 150% to ensure removal of titanium tungsten (TiW) that may have been formed on the top surface of the bond pad metal 802. The deep moat 804 may be formed by increasing that over etch from 150% to 1000% percent, which in one embodiment results in a deep moat 804 that is about 2.78 microns deep. Forming the deep moat 804 during the PDME process advantageously saves a processing step. It should be understood, however, that a deep moat may also be formed using a separate or additional masking and etching steps or together with another etch step without detracting from the merits of the present invention.

Figure 11:
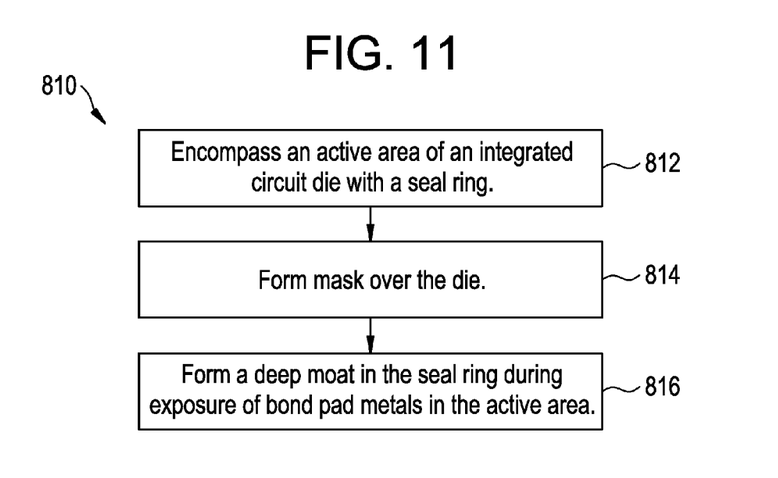
FIG. 11 shows a flow diagram of a method of forming a deep moat in a seal ring in accordance with an embodiment of the present invention.

FIG. 11 shows a flow diagram of a method 810 of forming a deep moat in a seal ring in accordance with an embodiment of the present invention. The method 810 may be performed using conventional semiconductor processing technology. In step 812, a seal ring encompasses an active area of an integrated circuit die. Preferably, the seal ring completely surrounds the active area. In step 814, a mask is formed over the die. The mask allows for an etching step that exposes bond pad metals in the die and forms a deep moat. In step 816, a deep moat is formed in the seal ring during an etch process that exposes bond pad metals in the active area. That is, the deep moat is formed during the etch process that removes material from the top surface of the bond pad metals. The deep moat may be formed to a depth that extends to the substrate or substantially all the way to the substrate. The deep moat may also be formed to have a depth greater than or equal to about 2.5 microns. The deep moat may be left empty until after the die is sliced from the wafer. During packaging, which is after the dicing process, the deep moat may be filled with molding compound.

The use of a deep moat in a seal ring provides advantages heretofore unrealized. Firstly, the deep moat is more effective in preventing cracks from propagating into the active area compared to conventional shallow moats. Secondly, the deep moat may be formed without additional mask and etching steps in the fabrication process. Thirdly, because the effectiveness of the deep moat is based on its depth rather than width, the footprint of a seal ring that includes the deep moat can be made substantially the same across different processing technologies.

Figure 12A:
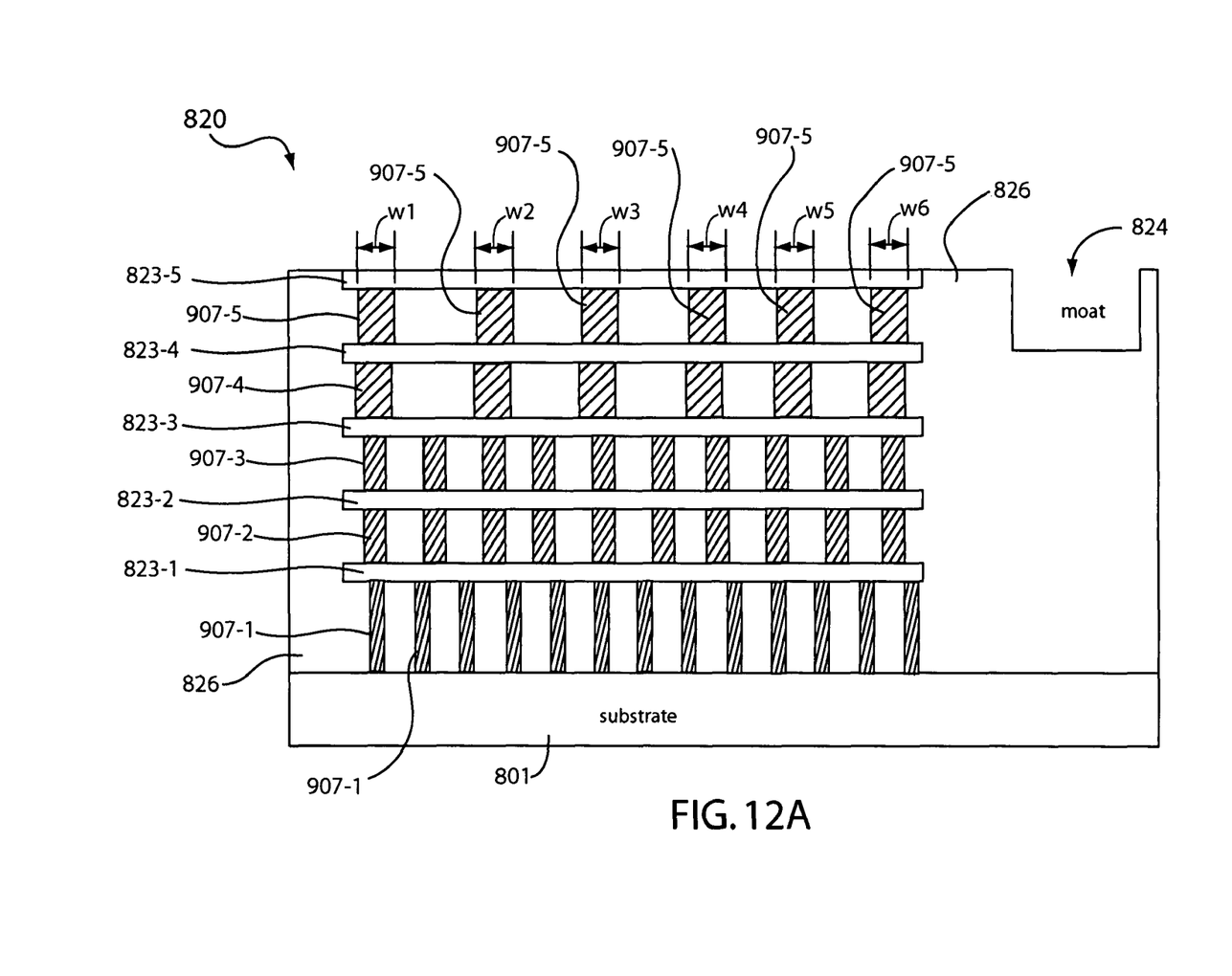
FIGS. 12A and 12B show seal rings in accordance with other embodiments of the present invention.

FIG. 12A shows a seal ring 820 in accordance with an embodiment of the present invention. The seal ring 820 includes several seal ring metal layers 823 (i.e. 823-1, 823-2, . . . ) that are electrically coupled together by way of vias 907 (i.e. 907-1, 907, 2 . . . ). Note that some of the vias 907 have not been labeled for clarity of illustration. In the example of FIG. 12A, the seal ring 820 has five metal levels with metal layer 823-1 as the first metal level, metal layer 823-2 as the second metal level, and so on. The metal layer 823-1 is electrically connected to the substrate 801, which may be a semiconductor substrate. The metal layers 823 may have substantially the same widths. The seal ring 820 also includes a shallow moat 824. The seal ring 820 encompasses an active area (not shown) and serves the same function as the previously discussed seal ring 303 (see FIG. 5).

Unlike seal ring 303, however, the seal ring 820 does not require a deep moat to prevent cracks originating from an edge of the die from propagating into the active area. Instead, the seal ring 820 includes redundant vias 907 that serve as physical barriers for stopping cracks. That is, the seal ring 820 includes more than one via on each particular level, with the number of vias on each level being configured to prevent crack propagation. The inventor has discovered that seal ring 820 is particularly effective in stopping cracks when the sum of the widths of all vias 907 on a particular level is greater than about 0.55 microns. That is, given w as the width of a via, and there are n vias on a particular level, then $$w1+w2+w3+\ldots+w_n >= 0.55 \text{ microns} \quad (Eq. 1)$$

Using vias 907-5 between metal layers 823-5 and 823-4 as an example, w1+w2+w3+w4+w5+w6 should be greater than or equal to 0.55 microns to be particularly effective in preventing crack propagation. Redundant vias 907-4. 904-3, etc. may also conform to Eq. 1.

Figure 12B:
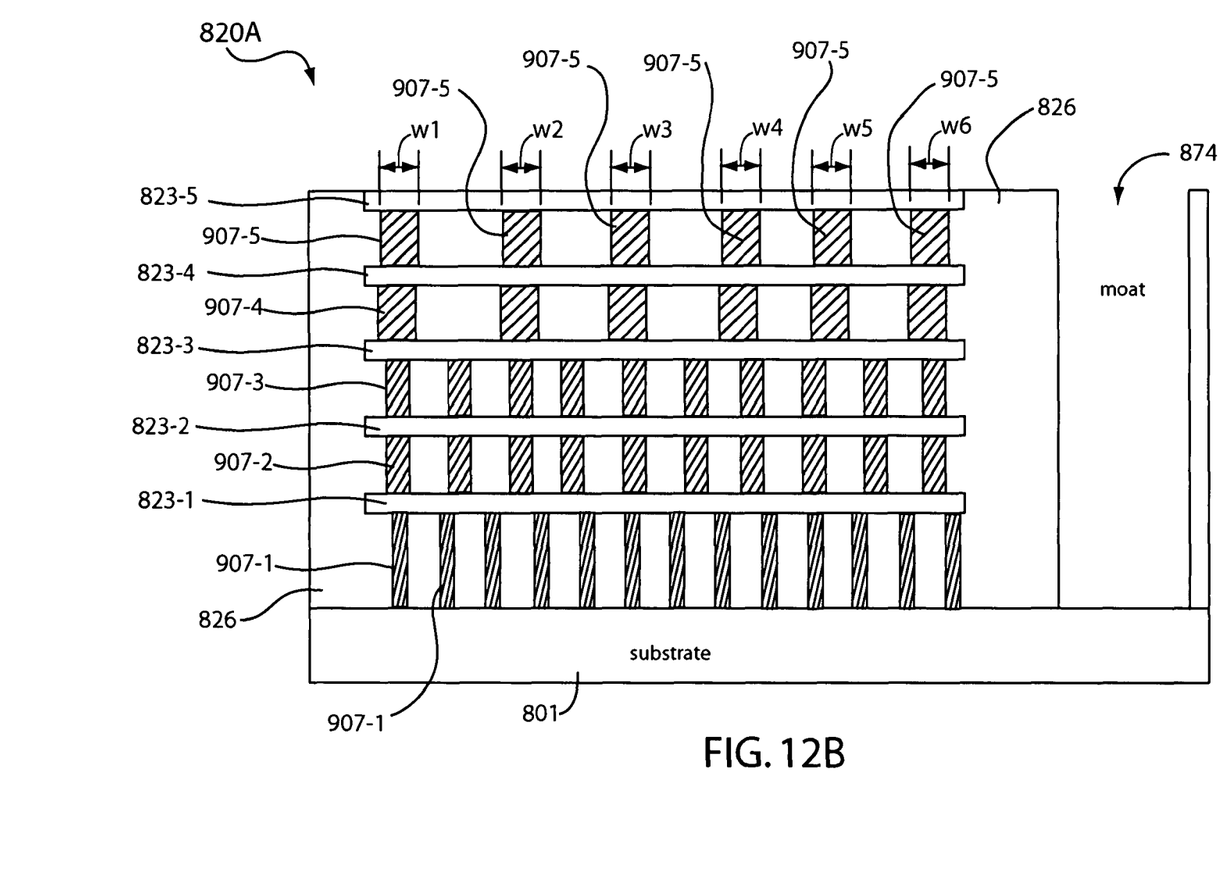

FIG. 12B shows a seal ring 820A in accordance with an embodiment of the present invention. The seal ring 820A is a specific embodiment of the seal ring 820. The seal ring 820A is essentially the same as the seal ring 820 except for the use of a deep moat 874 instead of a shallow moat 824. The use of redundant vias 907 and a deep moat 874 makes the seal ring 820A even more effective in preventing cracks from propagating into the active area of the die. In the example of FIG. 12B, the deep moat 874 is formed all the way to the substrate 801. The other features of the seal ring 820A have been previously discussed in connection with the seal ring 820 of FIG. 12A.

Improved seal rings for integrated circuits have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An integrated circuit device comprising:
  an active area on a die comprising circuitry configured to perform core functionality of the device;
  a seal ring including a plurality of seal ring metal layers encompassing the active area, the plurality of seal ring metal layers including at least a first seal ring metal layer overlying a surface of the die and a second seal ring metal layer above the first seal ring metal layer, the seal ring further including a first plurality of redundant vias extending from the first seal ring metal layer to the second seal ring metal layer, the first plurality of redundant vias spaced apart from one another about the seal ring; and a second plurality of redundant vias extending from the first seal ring metal layer to the surface of the die; and
  wherein the first plurality of redundant vias comprise widths greater than widths of the second plurality of redundant vias, the second plurality of redundant vias comprise a number of vias greater than a number of the first plurality of redundant vias.

2. The integrated circuit device of claim 1, wherein a sum of widths of the first plurality of redundant vias is selected to serve as physical barriers to prevent crack propagation into the active area.

3. The integrated circuit device of claim 1, wherein a sum of widths of the second plurality of redundant vias is equal to a sum of widths of the first plurality of redundant vias.

4. The integrated circuit device of claim 3, wherein the seal ring further comprises a third seal ring metal layer above the second seal ring metal layer, and a third plurality of redundant vias extending from the third seal ring metal layer to the second seal ring metal layer.

5. The integrated circuit device of claim 4, wherein a sum of widths of the third plurality of redundant vias is selected to serve as physical barriers to prevent crack propagation into the active area, and is equal to the sum of widths of the first plurality of redundant vias and to the sum of widths of the second plurality of redundant vias.

6. The integrated circuit device of claim 5, wherein the sum of widths of the first plurality of redundant vias, the sum of widths of the second plurality of redundant vias and the sum of widths of the third plurality of redundant vias is greater than or equal to about 0.55 microns.

7. The integrated circuit device of claim 4, wherein each seal ring metal layer in the plurality of seal ring metal layers is wider than another seal ring metal layer below it.

8. The integrated circuit device of claim 4, wherein each seal ring metal layer in the plurality of seal ring metal layers has substantially same width as another seal ring metal layer below it.

9. An integrated circuit device comprising:
  an active area on a die comprising circuitry configured to perform core functionality of the device; and
  a seal ring including a plurality of seal ring metal layers encompassing the active area, the plurality of seal ring metal layers including at least a first seal ring metal layer overlying a surface of the die and a second seal ring metal layer above the first seal ring metal layer, the seal ring further including a first plurality of redundant vias spaced apart from one another about the seal ring and extending from the first seal ring metal layer to the second seal ring metal layer, and a second plurality of redundant vias spaced apart from one another about the seal ring and extending from the first seal ring metal layer to the surface of the die, wherein the first plurality of redundant vias comprise widths greater than widths of the second plurality of redundant vias, and a sum of widths of the first plurality of redundant vias and a sum of widths of the second plurality of redundant vias are each greater than or equal to about 0.55 microns.

10. The integrated circuit device of claim 9, wherein the seal ring further comprises a third seal ring metal layer above the second seal ring metal layer, and a third plurality of redundant vias extending from the third seal ring metal layer to the second seal ring metal layer.

11. The integrated circuit device of claim 10, wherein a sum of widths of the third plurality of redundant vias is equal to the sum of widths of the first plurality of redundant vias and to the sum of widths of the second plurality of redundant vias.

12. The integrated circuit device of claim 10, wherein each seal ring metal layer in the plurality of seal ring metal layers is wider than another seal ring metal layer below it.

13. The integrated circuit device of claim 10, wherein each seal ring metal layer in the plurality of seal ring metal layers has substantially same width as another seal ring metal layer below it.

14. The integrated circuit device of claim 9, a moat extending to the surface of the die through a dielectric layer overlying the active area and the seal ring, the moat comprising a continuous trench encompassing the active area and the seal ring, but separated from the plurality of seal ring metal layers by the dielectric layer.

15. An integrated circuit device comprising:
an active area on a die comprising circuitry configured to perform core functionality of the device;
a seal ring encompassing the active area, the seal ring including a plurality of seal ring metal layers encompassing the active area, the plurality of seal ring metal layers including at least a first seal ring metal layer overlying a surface of the die and a second seal ring metal layer above the first seal ring metal layer, the seal ring further including a first plurality of redundant vias spaced apart from one another about the seal ring and extending from the first seal ring metal layer to the second seal ring metal layer, and a second plurality of redundant vias spaced apart from one another about the seal ring and extending from the first seal ring metal layer to the surface of the die, wherein the second plurality of redundant vias comprise a larger number of vias than the first plurality of redundant vias; and
a deep moat extending to a surface of the die through a dielectric layer overlying the active area and the seal ring, the deep moat comprising a continuous trench encompassing the active area and the seal ring, but separated from the seal ring by the dielectric layer.

16. The integrated circuit device of claim 15, wherein the deep moat is filled with a molding compound deposited during packaging of the integrated circuit device, after the die has been diced from a larger substrate.

17. The integrated circuit device of claim 15, wherein the deep moat has a depth greater than or equal to about 2.5 microns.

18. The integrated circuit device of claim 15, wherein the plurality of seal ring metal layers further comprises a third seal ring metal layer above the second seal ring metal layer, and a third plurality of redundant vias extending from the third seal ring metal layer to the second seal ring metal layer, and wherein a sum of widths of the first plurality of redundant vias, a sum of widths of the second plurality of redundant vias and a sum of widths of the third plurality of redundant vias are each greater than or equal to about 0.55 microns.

19. The integrated circuit device of claim 1, wherein a sum of widths of the first plurality of redundant vias and a sum of widths of the second plurality of redundant vias are greater than or equal to about 0.55 microns.

20. The integrated circuit device of claim 18, wherein each seal ring metal layer in the plurality of seal ring metal layers is wider than another seal ring metal layer below it.

* * * * *